United States Patent
Niwa et al.

(10) Patent No.: US 10,332,754 B2
(45) Date of Patent: Jun. 25, 2019

(54) METHOD OF MANUFACTURING NITRIDE SEMICONDUCTOR DEVICE

(71) Applicant: TOYODA GOSEI CO., LTD., Kiyosu (JP)

(72) Inventors: Takaki Niwa, Kiyosu (JP); Takahiro Fujii, Kiyosu (JP); Masayoshi Kosaki, Kiyosu (JP); Tohru Oka, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/164,988

(22) Filed: May 26, 2016

(65) Prior Publication Data
US 2017/0092493 A1 Mar. 30, 2017

(30) Foreign Application Priority Data

Sep. 30, 2015 (JP) ................................. 2015-192663

(51) Int. Cl.
*H01L 21/02* (2006.01)
*H01L 21/324* (2006.01)
*H01L 21/265* (2006.01)
*H01L 29/20* (2006.01)

(52) U.S. Cl.
CPC ...... *H01L 21/3245* (2013.01); *H01L 21/0254* (2013.01); *H01L 21/02458* (2013.01); *H01L 21/26546* (2013.01); *H01L 29/2003* (2013.01)

(58) Field of Classification Search
CPC .............................................. H01L 21/02694
See application file for complete search history.

(56) References Cited

U.S. PATENT DOCUMENTS

| 5,700,714 A * | 12/1997 | Ogihara .............. H01L 33/0008 257/E21.152 |
| 2008/0160729 A1* | 7/2008 | Krueger .................. G03F 7/427 438/514 |
| 2009/0127564 A1 | 5/2009 | Irikura et al. |

(Continued)

FOREIGN PATENT DOCUMENTS

| JP | 2007-317794 A | 12/2007 |
| JP | 2009-126727 A | 6/2009 |

(Continued)

OTHER PUBLICATIONS

Japanese Office Action dated Jul. 24, 2018 an English Translation.

*Primary Examiner* — Peniel M Gumedzoe
*Assistant Examiner* — Christopher A Johnson
(74) *Attorney, Agent, or Firm* — McGinn IP Law Group, PLLC

(57) ABSTRACT

There is provided a method of manufacturing a nitride semiconductor device. The method of manufacturing the nitride semiconductor device comprises: a first film forming process that forms a first film on a nitride semiconductor layer; an ion implantation process that implants a P-type impurity into the nitride semiconductor layer through the first film by ion implantation; a second film forming process that forms a second film on the first film, after the ion implantation process; and a heat treatment process that processes the nitride semiconductor layer by heat treatment after the second film forming process. This suppresses the surface of the nitride semiconductor layer from being roughened.

24 Claims, 6 Drawing Sheets

(56) References Cited

U.S. PATENT DOCUMENTS

| | | | |
|---|---|---|---|
| 2011/0207256 A1* | 8/2011 | Su | C23C 16/34 438/46 |
| 2014/0054680 A1 | 2/2014 | Hashimoto et al. | |
| 2014/0120703 A1 | 5/2014 | Iwami | |
| 2015/0011080 A1 | 1/2015 | Agraffeil | |
| 2015/0380498 A1* | 12/2015 | Tanaka | H01L 29/7802 257/76 |
| 2016/0093510 A1* | 3/2016 | Agraffeil | H01L 21/26553 438/542 |

FOREIGN PATENT DOCUMENTS

| | | |
|---|---|---|
| JP | 2012-049216 A | 3/2012 |
| JP | 2014-041917 A | 3/2014 |
| JP | 2014-086698 A | 5/2014 |
| JP | 2015-015467 A | 1/2015 |
| JP | 2015-046441 A | 3/2015 |
| JP | 2006-072629 A | 5/2016 |
| JP | 2016-072629 A | 5/2016 |
| WO | WO 2015/029578 A1 | 3/2015 |

\* cited by examiner

METHOD OF MANUFACTURING NITRIDE SEMICONDUCTOR DEVICE

CROSS-REFERENCE TO RELATED APPLICATION

The present application claims priority from Japanese patent applications No. 2015-192663 filed on Sep. 30, 2015, the content of which is hereby incorporated by reference into this application.

BACKGROUND

Technical Field

The invention relates to a method of manufacturing a nitride semiconductor device.

Description of the Related Art

A known configuration of a semiconductor device includes a semiconductor layer that is made of a nitride semiconductor, for example, gallium nitride (GaN) (for example, JP 2014-086698A). Ion implantation may be employed to form a P-type region in a specified area of the semiconductor layer.

JP 2014-086698A describes a method that forms a silicon dioxide ($SiO_2$) layer of 50 nm in thickness on a gallium nitride layer to serve as a protective layer for protecting the surface of the gallium nitride layer, performs ion implantation and performs heat treatment at temperature of 800° C. to 900° C. JP 2014-041917A describes a method that performs ion implantation into a gallium nitride layer without providing a protective layer, forms an aluminum nitride (AlN) layer to protect the surface of the gallium nitride layer after performing the ion implantation and performs heat treatment. The relevant techniques are described in WO 2015/029578 and JP 2009-126727A.

In the technique described in JP 2014-086698A, however, the protective layer is formed rather thin to allow for ion permeation and has insufficient thickness as the protective layer in heat treatment. There is accordingly a likelihood that nitrogen present in the gallium nitride layer is dropped off during heat treatment to roughen the surface of the gallium nitride layer. In the technique described in JP 2014-041917A, on the other hand, the protective layer may be denatured by heat during heat treatment. This may make it difficult to remove the protective layer. There is accordingly a need to expose the gallium nitride layer to rather extreme conditions for removal of the protective layer. This may result in roughening the surface of the gallium nitride layer.

There is accordingly a demand for a technique that suppresses the surface of the nitride semiconductor layer from being roughened by ion implantation or by heat treatment.

SUMMARY

In order to solve at least part of the problems described above, the invention may be implemented by aspects described below.

(1) According to one aspect of the invention, there is provided a method of manufacturing a nitride semiconductor device. The method of manufacturing the nitride semiconductor device comprises: a first film forming process that forms a first film on a nitride semiconductor layer; an ion implantation process that implants a P-type impurity into the nitride semiconductor layer through the first film by ion implantation; a second film forming process that forms a second film on the first film, after the ion implantation process; and a heat treatment process that processes the nitride semiconductor layer by heat treatment after the second film forming process. The method of manufacturing the nitride semiconductor device of this aspect forms the first film prior to the ion implantation process and forms the second film prior to the heat treatment process. This suppresses the surface of the nitride semiconductor layer from being roughened by ion implantation or by heat treatment.

(2) According to one embodiment of the method of manufacturing the nitride semiconductor device of the above aspect, the first film may have thickness of 1 nm to 100 nm. The method of manufacturing the nitride semiconductor device of this aspect allows for efficient ion implantation.

(3) According to one embodiment of the method of manufacturing the nitride semiconductor device of the above aspect, the second film may be formed by metal organic chemical vapor deposition at temperature of not lower than 300° C. and not higher than 800° C. The method of manufacturing the nitride semiconductor device of this aspect forms the first film prior to the ion implantation process and forms the second film prior to the heat treatment process. This suppresses the surface of the nitride semiconductor layer from being roughened by ion implantation or by heat treatment.

(4) According to one embodiment of the method of manufacturing the nitride semiconductor device of the above aspect, the P-type impurity may be either magnesium or beryllium. The method of manufacturing the nitride semiconductor device of this aspect forms the first film prior to the ion implantation process and forms the second film prior to the heat treatment process. This suppresses the surface of the nitride semiconductor layer from being roughened by ion implantation or by heat treatment.

(5) According to one embodiment of the method of manufacturing the nitride semiconductor device of the above aspect, the heat treatment process may be performed at temperature of not lower than 900° C. and not higher than 1600° C. The method of manufacturing the nitride semiconductor device of this aspect forms the first film prior to the ion implantation process and forms the second film prior to the heat treatment process. This suppresses the surface of the nitride semiconductor layer from being roughened by ion implantation or by heat treatment.

(6) According to one embodiment of the method of manufacturing the nitride semiconductor device of the above aspect, the first film may be made of a nitride semiconductor containing at least one of aluminum and indium. The method of manufacturing the nitride semiconductor device of this aspect forms the first film prior to the ion implantation process and forms the second film prior to the heat treatment process. This suppresses the surface of the nitride semiconductor layer from being roughened by ion implantation or by heat treatment.

(7) According to one embodiment of the method of manufacturing the nitride semiconductor device of the above aspect, the second film may be made of a nitride semiconductor. The method of manufacturing the nitride semiconductor device of this aspect forms the first film prior to the ion implantation process and forms the second film prior to the heat treatment process. This suppresses the surface of the nitride semiconductor layer from being roughened by ion implantation or by heat treatment.

(8) According to one embodiment of the method of manufacturing the nitride semiconductor device of the above aspect, the second film may be made of a nitride semiconductor containing at least one of aluminum and indium. The method of manufacturing the nitride semiconductor device of this aspect forms the first film prior to the ion implantation process and forms the second film prior to the heat treatment process. This suppresses the surface of the nitride semiconductor layer from being roughened by ion implantation or by heat treatment.

(9) According to one embodiment of the method of manufacturing the nitride semiconductor device of the above aspect, the second film forming process and the heat treatment process may be performed in an identical apparatus. The method of manufacturing the nitride semiconductor device of this aspect does not need a process of moving the nitride semiconductor layer with the first film and the second film formed thereon into another apparatus. This reduces the total number of manufacturing processes.

(10) According to one embodiment of the method of manufacturing the nitride semiconductor device of the above aspect, the first film may contain substantially no silicon. The method of manufacturing the nitride semiconductor device of this aspect forms the first film prior to the ion implantation process and forms the second film prior to the heat treatment process. This suppresses the surface of the nitride semiconductor layer from being roughened by ion implantation or by heat treatment.

(11) According to one embodiment of the method of manufacturing the nitride semiconductor device of the above aspect, the heat treatment process may be performed at temperature of not lower than 900° C. and not higher than 1200° C. in an ammonia-containing atmosphere. The method of manufacturing the nitride semiconductor device of this aspect forms the first film prior to the ion implantation process and forms the second film prior to the heat treatment process. This suppresses the surface of the nitride semiconductor layer from being roughened by ion implantation or by heat treatment.

(12) According to one embodiment of the method of manufacturing the nitride semiconductor device of the above aspect, the second film may contain silicon. The method of manufacturing the nitride semiconductor device of this aspect forms the first film prior to the ion implantation process and forms the second film prior to the heat treatment process. This suppresses the surface of the nitride semiconductor layer from being roughened by ion implantation or by heat treatment.

(13) According to one embodiment, the method of manufacturing the nitride semiconductor device of the above aspect may further comprise a film removal process that removes the first film and the second film, after the heat treatment process. The method of manufacturing the nitride semiconductor device of this aspect forms the first film prior to the ion implantation process and forms the second film prior to the heat treatment process. This suppresses the surface of the nitride semiconductor layer from being roughened by ion implantation or by heat treatment.

(14) According to one embodiment of the method of manufacturing the nitride semiconductor device of the above aspect, the film removal process may include a process of performing wet etching. The method of manufacturing the nitride semiconductor device of this aspect forms the first film prior to the ion implantation process and forms the second film prior to the heat treatment process. This suppresses the surface of the nitride semiconductor layer from being roughened by ion implantation or by heat treatment.

The invention may be implemented by any of various aspects other than the method of manufacturing the nitride semiconductor device described above, for example, a manufacturing apparatus for manufacturing a nitride semiconductor device by the above manufacturing method.

The method of manufacturing the nitride semiconductor device according to any of the above aspects forms the first film prior to the ion implantation process and forms the second film prior to the heat treatment process. This suppresses the surface of the nitride semiconductor layer from being roughened by ion implantation or by heat treatment.

DESCRIPTION OF THE EMBODIMENTS

A. First Embodiment

A-1. Configuration of Semiconductor Device

Figure 1:
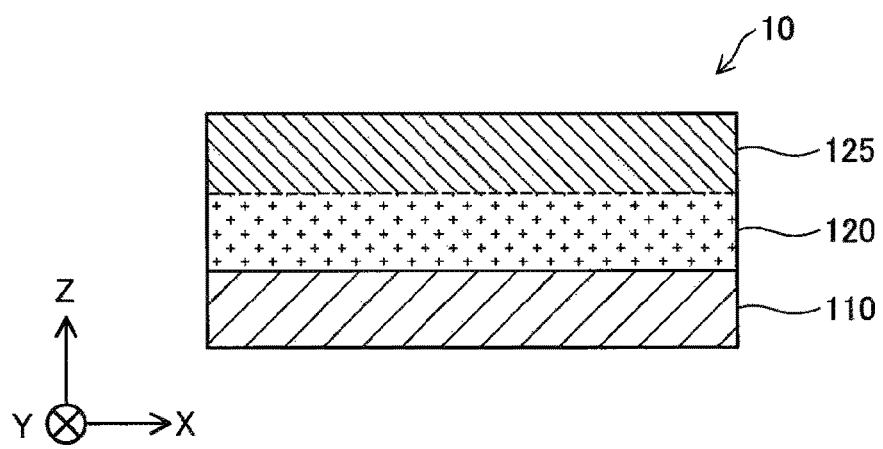
FIG. 1 is a sectional view schematically illustrating the configuration of a semiconductor device according to a first embodiment.

FIG. 1 is a sectional view schematically illustrating the configuration of a semiconductor device 10 according to a first embodiment. XYZ axes orthogonal to one another are illustrated in FIG. 1. The semiconductor device 10 is a nitride semiconductor device including a nitride semiconductor layer 120.

Among the XYZ axes of FIG. 1, the X axis denotes a left-right axis on the sheet surface of FIG. 1. +X-axis direction denotes a rightward direction on the sheet surface, and −X-axis direction denotes a leftward direction on the sheet surface. Among the XYZ axes of FIG. 1, the Y axis denotes a front-back axis on the sheet surface of FIG. 1. +Y-axis direction denotes a backward direction on the sheet surface, and −Y-axis direction denotes a forward direction on the sheet surface. Among the XYZ axes of FIG. 1, the Z axis denotes a top-bottom axis on the sheet surface of FIG. 1. +Z-axis direction denotes an upward direction on the sheet surface, and −Z-axis direction denotes a downward direction on the sheet surface.

The semiconductor device 10 is a GaN-based semiconductor device formed using gallium nitride (GaN). The semiconductor device 10 includes a substrate 110 and a nitride semiconductor layer 120.

The substrate 110 of the semiconductor device 10 is a semiconductor layer extended along the X axis and the Y axis. According to this embodiment, the substrate 110 is mainly made of gallium nitride (GaN). Another material, for example, sapphire ($Al_2O_3$), silicon carbide (SiC), silicon (Si) or aluminum gallium nitride (AlGaN) may also be used as the material of the substrate 110. In the description hereof, the expression of "being mainly made of" denotes "containing 90% or a higher at molar fraction.

The nitride semiconductor layer 120 of the semiconductor device 10 is an n-type semiconductor layer made of a nitride semiconductor and extended along the X axis and the Y axis. According to this embodiment, the nitride semiconductor layer 120 is mainly made of gallium nitride (GaN) and contains silicon (Si) as the donor. The nitride semiconductor layer 120 is laid on a +Z-axis direction side surface of the substrate 110. Non-doped gallium nitride (GaN) or aluminum gallium nitride (AlGaN) may also be used for the nitride semiconductor layer 120, but gallium nitride (GaN) is used preferably.

A P-type semiconductor region 125 of the semiconductor device 10 is part of a +Z-axis direction side area of the nitride semiconductor layer 120 and is formed by ion implantation. The semiconductor in the P-type semiconductor region 125 mainly has P-type characteristics. According to this embodiment, the P-type semiconductor region 125 is mainly made of gallium nitride (GaN), like the nitride semiconductor layer 120.

A-2. Method of Manufacturing Semiconductor Device

Figure 2:
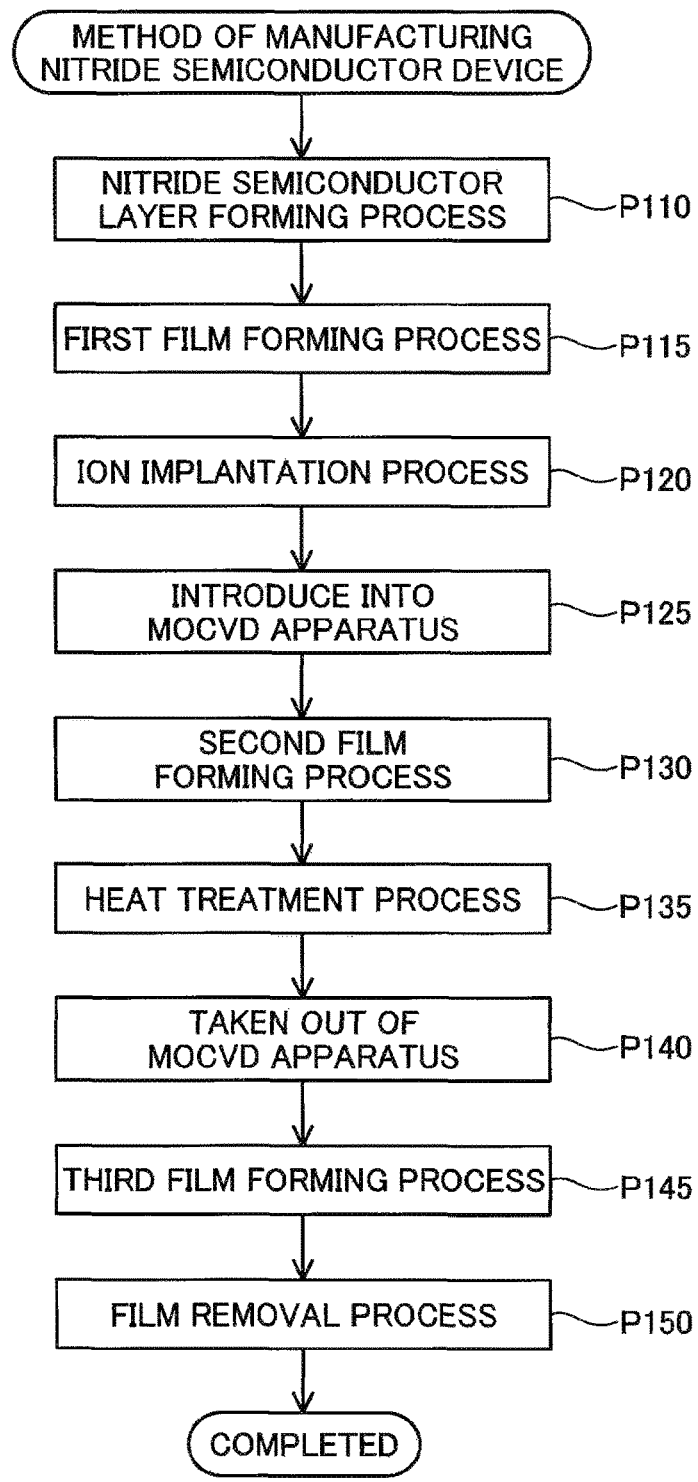
FIG. 2 is a process chart showing a method of manufacturing the semiconductor device.

FIG. 2 is a process chart showing a method of manufacturing the semiconductor device 10. In manufacture of the semiconductor device 10, the manufacturer forms a nitride semiconductor layer 120 on a substrate 110 by epitaxial growth at process P110. According to this embodiment, the manufacturer forms the nitride semiconductor layer 120 on the substrate 110 by epitaxial growth using an MOCVD apparatus performing metal organic chemical vapor deposition (MOCVD).

Figure 3:
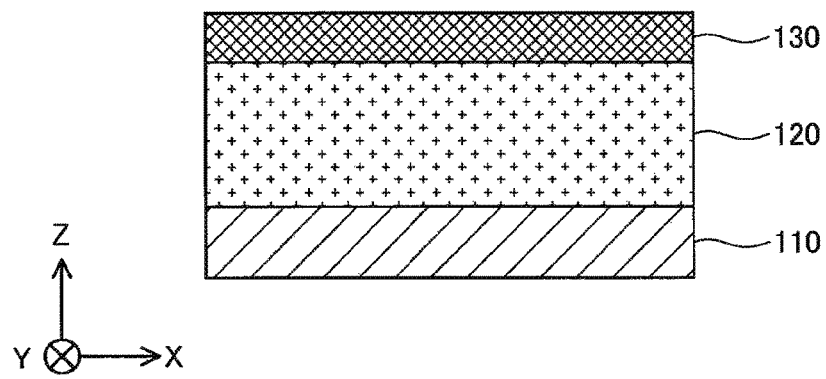
FIG. 3 is a diagram schematically illustrating formation of a first film.

After forming the nitride semiconductor layer 120 (process P110), the manufacturer forms a first film 130 on (more specifically, on the +Z-axis direction side of) the nitride semiconductor layer 120 at process P115, as shown in FIG. 3. The process P115 is also called first film forming process.

FIG. 3 is a diagram illustrating formation of the first film 130. The first film 130 serves to suppress a +Z-axis direction side surface of the nitride semiconductor layer 120 from being contaminated in a subsequent ion implantation process and suppress recoil of ions implanted by ion implantation. The first film 130 also provides a high dose impurity of the ion in the vicinity of the +Z-axis direction side surface of the nitride semiconductor layer 120 in the ion implantation process.

The film thickness of the first film 130 is preferably not less than 1 nm and is more preferably not less than 2 nm, in order to sufficiently cover the +Z-axis direction side surface of the nitride semiconductor layer 120. In order to allow for sufficient permeation of ions implanted by ion implantation, on the other hand, the film thickness of the first film 130 is preferably not greater than 100 nm and is more preferably not greater than 50 nm. The first film 130 having the film thickness in the above preferable range ensures more efficient ion implantation. According to this embodiment, the first film 130 has the film thickness of 30 nm.

In the case of ion implantation of a P-type impurity such as magnesium (Mg), it is preferable that the first film 130 contains no N-type impurity. For example, it is preferable that the first film 130 contains substantially no silicon (Si). In the case where the first film 130 contains silicon (Si) as an N-type impurity in the form of, for example, silicon dioxide ($SiO_2$) or silicon nitride (SiN), ions that are implanted by ion implantation and permeate through the first film 130 are likely to collide with the N-type impurity present in the first film 130, so that the collided N-type impurity is likely to be unintentionally implanted into the nitride semiconductor layer 120. This may result in decreasing a P-type carrier or producing an N-type carrier in the nitride semiconductor layer 120. The expression of "containing substantially no" denotes "containing less than 1% at molar fraction".

The first film 130 may be made of a nitride semiconductor containing at least one of aluminum (Al) and indium (In). According to this embodiment, aluminum nitride (AlN) is used as the material of the first film 130. Other available materials for the first film 130 include, for example, indium nitride (In), aluminum oxide ($Al_2O_3$), hafnium oxide (HMO, zirconium oxide ($ZrO_2$), magnesium oxide (MgO) and gallium oxide ($Ga_2O_3$). According to this embodiment, the first film 130 is formed by sputtering. According to another embodiment, the first film 130 may be formed by metal organic chemical vapor deposition (MOCVD) or chemical vapor deposition (CVD).

After the first film forming process (process P115), the manufacturer implant ions of P-type impurity into the nitride semiconductor layer 120 through the first film 130 at process P120. The process P120 is also called ion implantation process.

Figure 4:
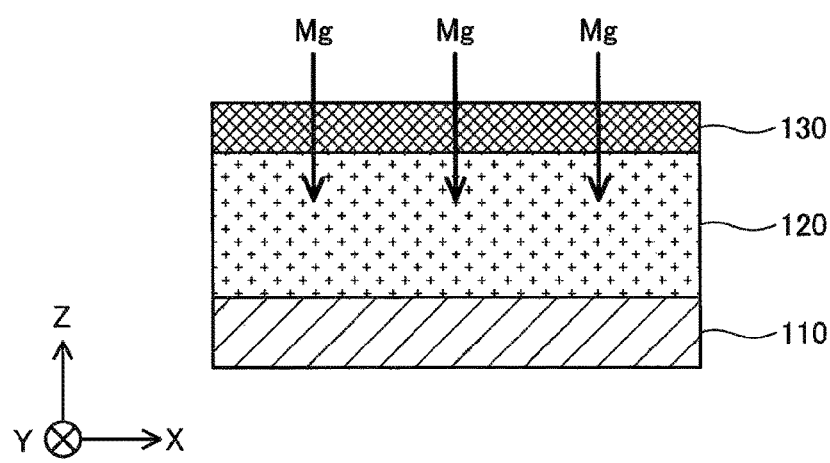
FIG. 4 is a diagram schematically illustrating ion implantation.

FIG. 4 is a diagram illustrating ion implantation. According to this embodiment, magnesium (Mg) is used as the P-type impurity for ion implantation. The P-type impurity for ion implantation may be another element, for example, beryllium (Be). The temperature of ion implantation is not specifically limited but may be room temperature. The temperature of ion implantation is preferably not lower than 500° C., in order to reduce possible crystal defects during ion implantation and facilitate the P-type impurity implanted by ion implantation to serve as the acceptor. The temperature of ion implantation is also preferably not higher than 600° C., in order to suppress nitrogen (N) from being dropped off from the surface of the nitride semiconductor layer 120.

After the ion implantation process (process P120), the manufacturer introduces the substrate 110 with the nitride semiconductor layer 120 and the first film 130 formed thereon into the MOCVD apparatus at process P125.

At subsequent process P130, the manufacturer forms a second film 140 on the first film 130. The process P130 is also called second film forming process.

Figure 5:
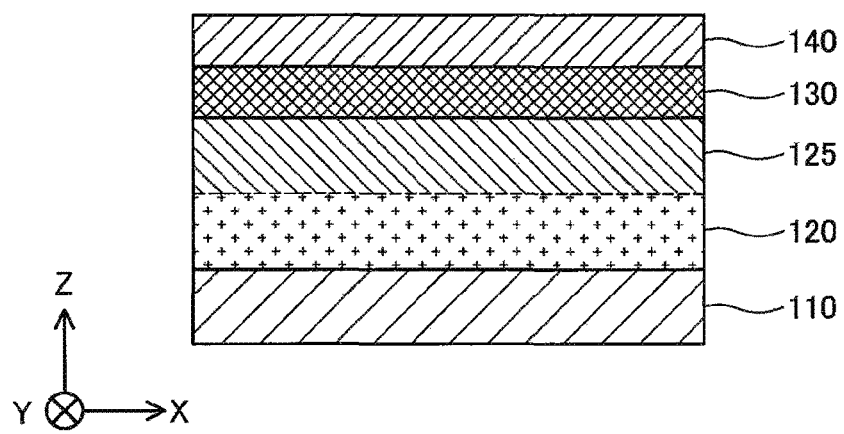
FIG. 5 is a diagram schematically illustrating formation of a second film.

FIG. 5 is a diagram illustrating formation of the second film 140. The second film 140 serves to suppress the +Z-axis direction side surface of the nitride semiconductor layer 120 from being roughened by subsequent heat treatment. For example, in the case where the first film 130 fails to cover part of the +Z-axis direction side surface of the nitride semiconductor layer 120, the second film 140 covers the part of the +Z-axis direction side surface of the nitride semiconductor layer 120 that is not covered by the first film 130. As a result, the second film 140 serves to suppress exposure of the +Z-axis direction side surface of the nitride semiconductor layer 120.

The film thickness of the second film 140 is preferably not less than 10 nm and not greater than 100 nm. The second film 140 having the film thickness of not less than 10 nm can sufficiently cover the +Z-axis direction side surface of the nitride semiconductor layer 120. The second film 140 having the film thickness of not greater than 100 nm, on the other hand, can be readily removed in a subsequent film removal process. According to this embodiment, the second film 140 has the film thickness of 70 nm.

The second film 140 may be made of a nitride semiconductor, for example, a nitride semiconductor containing at least one of aluminum (Al) and indium (In). According to this embodiment, aluminum nitride (AlN) is used as the material of the second film 140. The materials of the first film 130 and the second film 140 are not specifically limited.

For example, in the case where indium nitride (InN) is used as the material of the first film 130, gallium nitride (GaN) may be used as the material of the second film 140. In the case where indium nitride (InN) is used as the material of the second film 140, indium nitride (InN) is likely to be sublimated and removed by subsequent heat treatment. It is accordingly preferable to add a nitride semiconductor containing aluminum (Al) and gallium (Ga) to the material of the second film 140. The material of the second film 140 preferably includes, for example, indium aluminum nitride ($In_xAl_{1-x}N$ (0<x<1), indium gallium nitride ($In_xGa_{1-x}N$ (0<x<1), aluminum nitride (AlN) or gallium nitride (GaN).

According to this embodiment, the second film 140 may be formed by metal organic chemical vapor deposition (MOCVD) at temperature of not lower than 300° C. and not higher than 800° C. In general, in terms of forming a dense film, it is preferable to form a film by epitaxial growth at temperature of not lower than 1100° C. According to this embodiment, however, ion implantation is likely to roughen a +Z-axis direction side surface of the first film 130, this makes it difficult to form a dense film by epitaxial growth. In terms of forming a dense film, it is thus preferable to form the second film 140 by metal organic chemical vapor deposition at temperature of not lower than 300° C. and not higher than 800° C.

After the second film forming process (process P130), the manufacturer processes the nitride semiconductor layer 120 by heat treatment at process P135. The process P135 is also called heat treatment process. According to this embodiment, the heat treatment process (process P135) is performed subsequent to the second film forming process (process P130) in the same MOCVD apparatus. Accordingly the substrate 110 is not taken out of the MOCVD apparatus from the second film forming process (process P130) to the end of the heat treatment process (process P135). This heat treatment process (process P135) activates the P-type impurity implanted into the nitride semiconductor layer 120 by ion implantation. More specifically, the heat treatment process moves the implanted P-type impurity to adequate lattice positions in the nitride semiconductor layer 120 and recovers the nitride semiconductor layer 120 from damage by ion implantation, thus producing a P-type carrier.

The heat treatment temperature is preferably not lower than 900° C., in terms of more effectively activating the P-type impurity. In terms of suppressing nitrogen (N) from being dropped off from the nitride semiconductor layer 120 or the second film 140, the heat treatment temperature is not higher than 1400° C., and the atmosphere of heat treatment is a nitrogen (N)-containing atmosphere, and is preferably an ammonia ($NH_3$)-containing atmosphere. Preferably, the heat temperature is not higher than 1200° C. When heat treatment is performed in the ammonia ($NH_3$)-containing atmosphere, (i) it is preferable that the flow rate of ammonia gas is preferably not lower than 10 slm and not higher than 50 slm; and (ii) the internal pressure of the heat treatment space is preferably not lower than 10 Torr and not higher than 760 Torr and is more preferably not lower than 200 Torr and not higher than 400 Torr. The heat treatment time is preferably not shorter than 1 minute and not longer than 60 minutes. For example, at the heat treatment temperature of 1050° C., the heat treatment time of not shorter than 5 minutes is preferable to more effectively activate the P-type impurity in the nitride semiconductor layer 120.

Samples were heated at different heat treatment temperatures of 1050° C., 1100° C. and 1150° C., and the surface of the nitride semiconductor layer 120 of each sample was evaluated by photoluminescence method. According to the results of evaluation, the sample heated at the heat treatment temperature of 1150° C. had weak emission intensity at a band end and strong emission intensity of yellow luminescence. This result indicates that deep levels due to crystal defects are provided on the surface layer of the nitride semiconductor layer 120 in the sample heated at the heat treatment temperature of 1150° C. and suggests an increase of crystal defects. By taking into account these results, the heat treatment temperature is preferably lower than 1150° C. In terms of accelerating activation of the P-type impurity in the nitride semiconductor layer 120, the heat treatment temperature is preferably not lower than 900° C.

After the heat treatment process (process P135), the manufacturer takes out of the substrate 110 with the nitride semiconductor layer 120, the first film 130 and the second film 140 formed thereon from the MOCVD apparatus.

At subsequent process P145, the manufacturer forms a third film 150 on a −Z-axis direction side rear face of the substrate 110. The third film 150 serves to suppress the −Z-axis direction side rear face of the substrate 110 from being roughened by subsequent etching.

Figure 6:
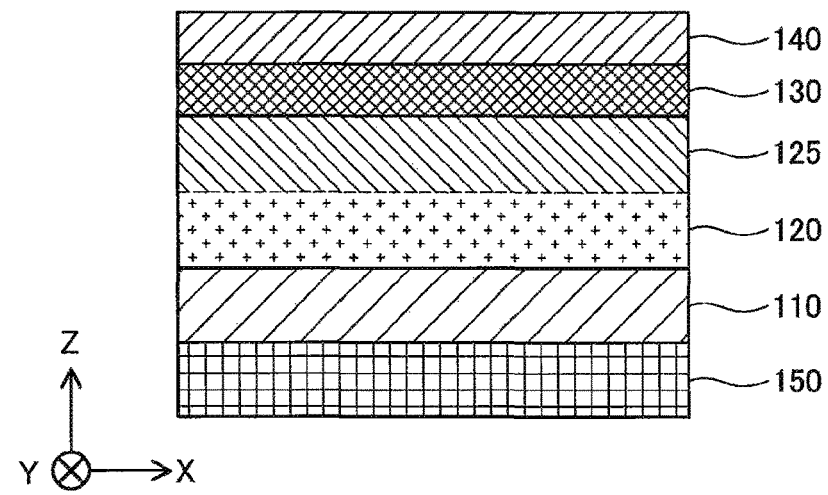
FIG. 6 is a diagram schematically illustrating formation of a third film.

FIG. 6 is a diagram illustrating formation of the third film 150. According to this embodiment, the third film 150 is made of silicon dioxide ($SiO_2$). According to this embodiment, the third film 150 is formed by chemical vapor deposition. According to another embodiment, the third film 150 may be formed by sputtering.

At subsequent process P150, the manufacturer removes the first film 130, the second film 140 and the third film 150. The process P150 is also called film removal process. According to this embodiment, wet etching is employed for the film removal process.

The manufacturer first removes the first film 130 and the second film 140 using a TMAH (tetramethylammonium hydroxide) aqueous solution that is an alkali aqueous solution. According to this embodiment, after the TMAH aqueous solution is heated to 60° C. or higher (more specifically, 85° C. in this embodiment), the substrate 110 is soaked in the TMAH aqueous solution for 15 minutes or longer. This process removes the first film 130 and the second film 140. Potassium hydroxide (KOH) may be used for the alkali aqueous solution.

The manufacturer subsequently removes the third film 150 and the residuals of the first film 130 and the second film 140 using a BHF (buffered hydrogen fluoride) aqueous solution or an HF (hydrofluoric acid) aqueous solution. According to this embodiment, the substrate 110 is soaked in the BHF aqueous solution or the HF aqueous solution for 5 minutes to 15 minutes and is then washed with ultrapure water.

The semiconductor device 10 is completed by this series of processes.

The method of manufacturing the semiconductor device 10 according to this embodiment forms the first film (process P115) prior to the ion implantation process (process P120). This suppresses the surface of the nitride semiconductor layer 120 from being roughened in the ion implantation process (process P120). The manufacturing method forms the second film (process P130) prior to the heat treatment process (process P135). This suppresses the surface of the nitride semiconductor layer 120 from being roughened in the heat treatment process (process P135).

In the case of a semiconductor layer using silicon (Si) as the semiconductor, silicon (Si) is the stable element and is unlikely to be dropped off from the semiconductor layer in the heat treatment process. It is thus unlikely that the surface of the semiconductor layer is roughened by heat treatment.

In the case of the nitrogen (N)-containing nitride semiconductor layer 120, on the other hand, nitrogen (N) is likely to be dropped off from the nitride semiconductor layer 120 in the heat treatment process. Accordingly, forming the second film 140 on the first film 130 at the process P130 prior to the heat treatment process (process P135) suppresses the +Z-axis direction side surface of the nitride semiconductor layer 120 from being roughened. Accordingly, the problem that the surface of the semiconductor layer is roughened by heat treatment without forming the second film 140 is not found in the silicon (Si) substrate but is characteristic of the semiconductor device including the nitride semiconductor layer 120.

According to this embodiment, the first film 130 and the second film 140 can be readily removed in the film removal process (process P150). The following describes the mechanism of removal. The first film 130 is damaged in the ion implantation process (process P120) and has a higher degree of crystal defects after the ion implantation process (process P120). The first film 130 is thus in the state to be readily removable in the film removal process (process P150). Even when a dense film is formed as the second film 140, the first film 130 can be readily removed from the nitride semiconductor layer 120 in the film removal process (process P150).

Figure 7A:
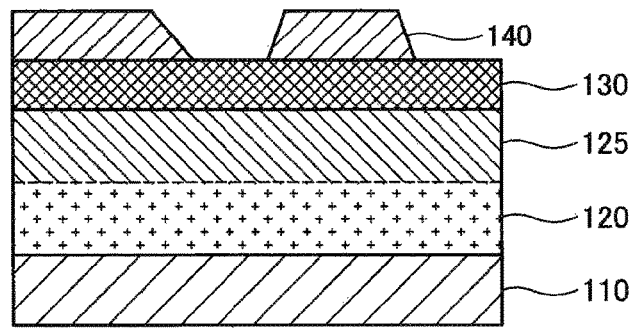
FIGS. 7A to 7C are diagrams schematically illustrating removal of the first film and the second film in a film removal process.
Figure 7B:
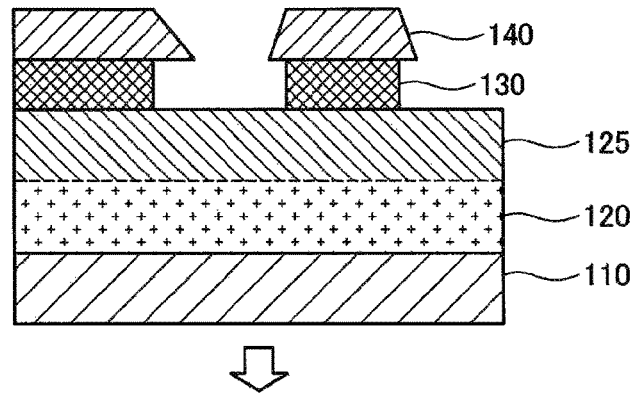
Figure 7C:
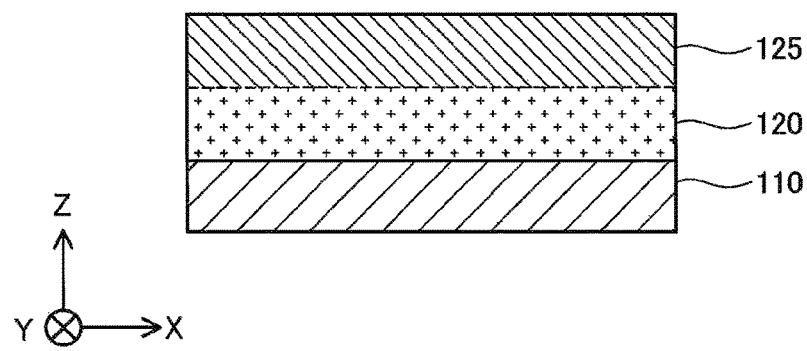

FIGS. 7A to 7C are diagrams illustrating removal of the first film 130 and the second film 140 in the film removal process (process P150). The third film 150 is omitted from the illustration of FIGS. 7A to 7C, for the purpose of easy explanation.

The film removal process (process P150) first removes part of the second film 140 to make part of the first film 130 exposed as shown in FIG. 7A. The first film 130 is then preferentially removed as shown in FIG. 7B. This is attributed to the higher degree of crystal defects in the first film 130 by the damage in the ion implantation process (process P120). Preferential removal of the first film 130 causes the second film 140 from being lifted off from the P-type semiconductor region 125. As a result, the first film 130 and the second film 140 are removed from the nitride semiconductor layer 120 as shown in FIG. 7C.

According to this embodiment, the first film 130 and the second film 140 are readily removed in the film removal process (process P150). This suppresses the nitride semiconductor layer 120 from being roughened in the film removal process (process P150).

According to this embodiment, the heat treatment process (process P135) is performed subsequent to the second film forming process (process P130) in the same MOCVD apparatus. This does not need a process of moving the substrate 110 to another apparatus and thereby reduces the total number of manufacturing processes.

B. Second Embodiment

Figure 8:
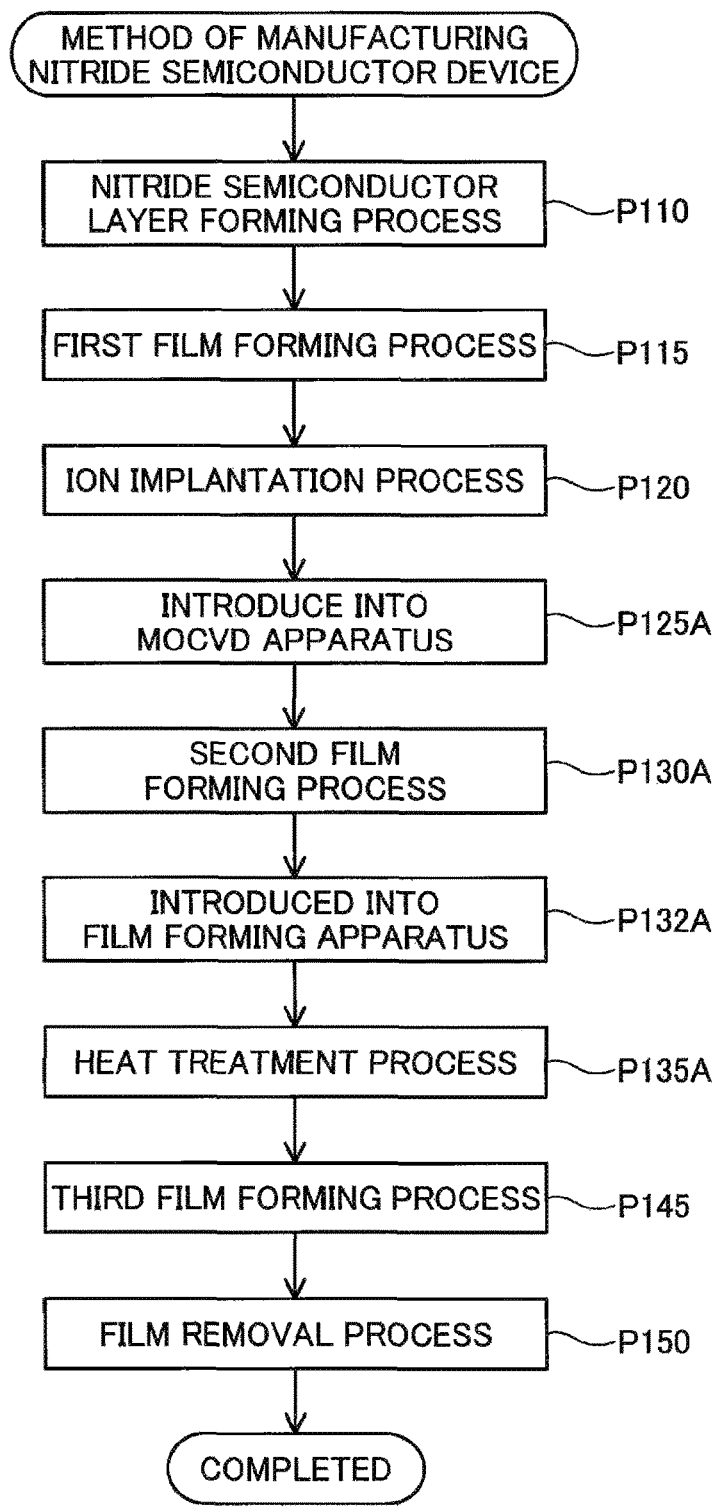
FIG. 8 is a process chart showing a method of manufacturing a semiconductor device according to a second embodiment.

FIG. 8 is a process chart showing a method of manufacturing a semiconductor device 10A according to a second embodiment. The method of manufacturing the semiconductor device 10A according to the second embodiment differs from the method of manufacturing the semiconductor device 10 according to the first embodiment (shown in FIG. 2) by that a heat treatment process (process P135A) is performed in a different apparatus from an apparatus used for the second film forming process (process P130) but is otherwise similar to the method of manufacturing the semiconductor device 10 according to the first embodiment. In other words, the method of manufacturing the semiconductor device 10A according to the second embodiment differs from the method of manufacturing the semiconductor device 10 according to the first embodiment (shown in FIG. 2) by a series of processes between the ion implantation process (process P120) and the third film forming process (process P145) but is otherwise similar to the method of manufacturing the semiconductor device 10 according to the first embodiment.

According to the second embodiment, after the ion implantation process (process P120), the manufacturer introduces the substrate 110 with the nitride semiconductor layer 120 and the first film 130 formed thereon into a film forming apparatus at process P125A. The film forming apparatus may be, for example, a sputtering apparatus or an MOCVD apparatus. According to this embodiment, a sputtering apparatus is employed as the film forming apparatus.

At subsequent process P130A, the manufacturer forms a second film 140A on the first film 130. The second film 140A may be, for example, an insulating film made of aluminum oxide ($Al_2O_3$), silicon dioxide ($SiO_2$), silicon nitride (SiN), zirconium oxide ($ZrO_2$), magnesium oxide (MgO) or gallium oxide ($Ga_2O_3$) or a carbon film made of hydrocarbon ($C_2H_2$). According to this embodiment, the second film 140A is made of the silicon (Si)-containing material, i.e., silicon dioxide ($SiO_2$).

After the second film forming process (process P130A), the manufacturer introduces the substrate 110 with the nitride semiconductor layer 120, the first film 130 and the second film 140A formed thereon into an RTA (rapid thermal annealing) apparatus. The substrate 110 may be introduced into an MOCVD apparatus, in place of the RTA apparatus.

At subsequent process P135A, the manufacturer processes the nitride semiconductor layer 120 by heat treatment. According to this embodiment, the second film 140A is made of the insulating material, i.e., silicon dioxide ($SiO_2$) and does not contain nitrogen (N), so that nitrogen (N) is not dropped off from the second film 140A itself. There is accordingly no need to perform heat treatment in the ammonia ($NH_3$)-containing atmosphere. By taking into account the likelihood that nitrogen (N) included in, for example, the nitride semiconductor layer 120 is dropped off across the second film 140A, it is preferable to perform heat treatment in a nitrogen (N)-containing atmosphere. The heat treatment temperature is preferably not lower than 900° C., in terms of more effectively activating the P-type impurity. In terms of suppressing the surface roughness of the nitride semiconductor layer 120 caused by drop-off of nitrogen (N) from the nitride semiconductor layer 120, on the other hand, the heat treatment temperature is preferably not higher than 1600° C. and is more preferably not higher than 1500° C.

The method of manufacturing the semiconductor device 10A according to this embodiment forms the first film (process P115) prior to the ion implantation process (process P120). This suppresses the surface of the nitride semiconductor layer 120 from being roughened in the ion implantation process (process P120). The manufacturing method forms the second film (process P130A) prior to the heat treatment process (process P135A). This suppresses the surface of the nitride semiconductor layer 120 from being roughened in the heat treatment process (process P135A).

C. Other Embodiments

The invention is not limited to any of the embodiments, the examples and the modifications described above but may be implemented by a diversity of other configurations without departing from the scope of the invention. For example, the technical features of any of the embodiments, the examples and modifications corresponding to the technical features of each of the aspects described in Summary may be replaced or combined appropriately, in order to solve part or all of the problems described above or in order to achieve part or all of the advantageous effects described above. Any of the technical features may be omitted appropriately unless the technical feature is described as essential herein.

The embodiment describes above uses the P-type impurity as the ion implantation specifies. The advantageous effects of the invention can be achieved by using an N-type impurity (for example, silicon (Si)) or by using an impurity for element isolation (for example, boron (B), oxygen (O), iron (Fe) or carbon (C)).

In the embodiment described above, the film removal process (P150) performs wet etching using the BHF aqueous solution or the HF aqueous solution after wet etching using the TMAH aqueous solution. The invention is, however, not limited to this procedure. For example, any of the following procedures may be employed in the film removal process (P150).

According to another embodiment, the film removal process (P150) may perform only the wet etching using the TMAH aqueous solution. The third film 150 serves to suppress formation of irregularities on the −Z-axis direction side rear face of the substrate 110 in the film removal process. In some cases, for example, in the case of forming electrodes on the −Z-axis direction side rear face of the substrate 110, however, a concavo-convex surface may be allowed for the −Z-axis direction side rear face of the substrate 110. In such cases, the film removal process (P150) may perform only the wet etching using the TMAH aqueous solution. Only the wet etching using the TMAH aqueous solution, however, provides the possibility that the residuals of the first film 130 and the second film 140 are left on the +Z-axis direction side surface of the nitride semiconductor layer 120. Accordingly the film removal process (P150) preferably performs the wet etching using the BHF aqueous solution or the HF aqueous solution after the wet etching using the TMAH aqueous solution.

According to another embodiment, the film removal process (P150) may sequentially perform (i) wet etching using the TMAH aqueous solution, (ii) wet etching using the BHF aqueous solution or the HF aqueous solution, and (iii) wet etching using hydrochloric acid (HCl). This procedure more effectively suppresses the residuals of the first film 130 and the second film 140 from being left on the +Z-axis direction side surface of the nitride semiconductor layer 120.

According to another embodiment, the film removal process (P150) may perform dry etching. For example, the film removal process (P150) may sequentially perform (i) wet etching using the TMAH aqueous solution, (ii) wet etching using the BHF aqueous solution or the HF aqueous solution, and (iii) dry etching using a chlorine (Cl)-containing etching gas. In the case where aluminum nitride (AlN) is used as the material of the first film 130, part of aluminum nitride (AlN) of the first film 130 may react with gallium nitride (GaN) of the nitride semiconductor layer 120 to produce aluminum gallium nitride (AlGaN) in the heat treatment process (process P135). This may make it difficult to remove the first film 130. Aluminum gallium nitride (AlGaN) is not readily removed by using the TMAH aqueous solution but is removable by dry etching using the chlorine (Cl)-containing etching gas. This procedure more effectively suppresses the residuals of the first film 130 and the second film 140 from being left on the +Z-axis direction side surface of the nitride semiconductor layer 120.

The method of manufacturing the nitride semiconductor device described in any of the above embodiments may be employed as part of a method of manufacturing another semiconductor device, for example, MESFET (metal-semiconductor field effect transistor) or HFET (hetero-FET).

What is claimed is:

1. A method of manufacturing a nitride semiconductor device, comprising:
    a first film forming process that forms a first film on a nitride semiconductor layer, the first film comprising a nitride semiconductor;
    an ion implantation process that implants a P-type impurity directly into a surface of the first film and into the nitride semiconductor layer through the first film by ion implantation, to form a p-type semiconductor region in the nitride semiconductor layer, a thickness of the p-type semiconductor region being less than a thickness of the nitride semiconductor layer;
    a second film forming process that forms a second film on the implanted surface of the first film, after the ion implantation process, the second film contacting the implanted surface of the first film and comprising a nitride semiconductor;
    a heat treatment process that processes the nitride semiconductor layer by heat treatment after the second film forming process, and
    a film removal process that removes the first film and the second film, after the heat treatment process,
    wherein the film removal process includes a process of performing wet etching,
    wherein the wet etching comprises:
        etching a part of the second film to expose the surface of the first film; and
        preferentially etching the exposed surface of the first film,
    wherein the preferentially etching of the exposed surface of the first film comprises simultaneously removing the first film and the second film, and
    wherein the ion implantation process is performed at a temperature in a range from 500° C. to 600° C.

2. The method of manufacturing the nitride semiconductor device according to claim 1,
    wherein the first film has thickness of 1 nm to 100 nm.

3. The method of manufacturing the nitride semiconductor device according to claim 1,
    wherein the second film is formed by metal organic chemical vapor deposition at temperature of not lower than 300° C. and not higher than 800° C.

4. The method of manufacturing the nitride semiconductor device according to claim 1,
    wherein the P-type impurity is either magnesium or beryllium.

5. The method of manufacturing the nitride semiconductor device according to claim 1,
    wherein the heat treatment process is performed at temperature of not lower than 900° C. and not higher than 1600° C.

6. The method of manufacturing the nitride semiconductor device according to claim 1,
    wherein the first film is made of a nitride semiconductor containing at least one of aluminum and indium.

7. The method of manufacturing the nitride semiconductor device according to claim 1,
    wherein the second film is made of a nitride semiconductor containing at least one of aluminum and indium.

8. The method of manufacturing the nitride semiconductor device according to claim 1, wherein the second film forming process and the heat treatment process are performed in an identical apparatus.

9. The method of manufacturing the nitride semiconductor device according to claim 1,
wherein the first film contains substantially no silicon.

10. The method of manufacturing the nitride semiconductor device according to claim 1,
wherein the heat treatment process is performed at temperature of not lower than 900° C. and not higher than 1200° C. in an ammonia-containing atmosphere.

11. The method of manufacturing the nitride semiconductor device according to claim 1,
wherein the second film contains silicon.

12. The method of manufacturing the nitride semiconductor device according to claim 1, wherein the nitride semiconductor layer comprises an n-type nitride semiconductor layer.

13. The method of manufacturing the nitride semiconductor device according to claim 1, wherein a thickness of the second film is greater than a thickness of the first film.

14. The method of manufacturing the nitride semiconductor device according to claim 1, wherein the first film contacts a surface of the nitride semiconductor layer.

15. A method of manufacturing a nitride semiconductor device, comprising:
a first film forming process that forms a first film on a nitride semiconductor layer, the first film comprising a nitride semiconductor;
an ion implantation process that implants a P-type impurity directly into a surface of the first film and into the nitride semiconductor layer through the first film by ion implantation, to form a p-type semiconductor region in the nitride semiconductor layer, a thickness of the p-type semiconductor region being less than a thickness of the nitride semiconductor layer;
a second film forming process that forms a second film on the implanted surface of the first film, after the ion implantation process, the second film contacting the implanted surface of the first film and comprising a nitride semiconductor;
a heat treatment process that processes the nitride semiconductor layer by heat treatment after the second film forming process; and
a film removal process that removes the first film and the second film, after the heat treatment process,
wherein the ion implantation process is performed at a temperature in a range from 500° C. to 600° C.,
wherein the nitride semiconductor layer is formed on a front face of a substrate, and
wherein the method further comprises:
before the film removal process, forming a third film on a rear face of the substrate to suppress a roughening of the rear face by the film removal process.

16. The method of manufacturing the nitride semiconductor device according to claim 15,
wherein the film removal process includes a process of performing wet etching.

17. The method of manufacturing the nitride semiconductor device according to claim 16, wherein the wet etching comprises:
etching a part of the second film to expose the surface of the first film; and
preferentially etching the exposed surface of the first film.

18. The method of manufacturing the nitride semiconductor device according to claim 17, wherein the preferentially etching of the exposed surface of the first film comprises simultaneously removing the first film and the second film.

19. The method of manufacturing the nitride semiconductor device according to claim 18, wherein a density of the second film is greater than a density of the first film.

20. A method of manufacturing a nitride semiconductor device, comprising:
forming a first film on a nitride semiconductor layer, the first film comprising a nitride semiconductor including at least one of aluminum and indium, and having a thickness in a range from 1 nm to 100 nm;
implanting a p-type impurity directly into a surface of the first film and into the nitride semiconductor layer through the first film by ion implantation, to form a p-type semiconductor region in the nitride semiconductor layer, a thickness of the p-type semiconductor region being less than a thickness of the nitride semiconductor layer, and the p-type impurity comprising one of magnesium and beryllium;
after the implanting of the p-type impurity, forming a second film on the implanted surface of the first film, the second film contacting the implanted surface of the first film and comprising a nitride semiconductor including at least one of aluminum and indium, and the second film being formed by metal organic chemical vapor deposition at a temperature in a range from 300° C. to 800° C.;
after the forming of the second film, heat treating the nitride semiconductor layer at a temperature in a range from 900° C. to 1600° C., the forming of the second film and the heat treating of the nitride semiconductor layer being performed in the same apparatus; and
after the heat treating of the nitride semiconductor layer, removing the first film and the second film by wet etching,
wherein the implanting of the p-type impurity is performed at a temperature in a range from 500° C. to 600° C.,
wherein the wet etching comprises:
etching a part of the second film to expose the surface of the first film; and
preferentially etching the exposed surface of the first film, and
wherein the preferentially etching of the exposed surface of the first film comprises simultaneously removing the first film and the second film.

21. The method of manufacturing the nitride semiconductor device according to claim 20, wherein the wet etching comprises:
etching a part of the second film to expose the implanted surface of the first film; and
preferentially etching the exposed surface of the first film.

22. A method of manufacturing a nitride semiconductor device, comprising:
forming a nitride semiconductor layer on a substrate, the substrate comprising one member selected from the group consisting of gallium nitride (GaN), sapphire ($Al_2O_3$), silicon carbide (SiC), silicon (Si) and aluminum gallium nitride (AlGaN);
forming a first film on a surface of the nitride semiconductor layer, the first film contacting the surface of the nitride semiconductor layer and including less than 1% by molar fraction of N-type impurity, a thickness of the first film being in a range from 2 nm to 50 nm, and the first film comprising one of aluminum nitride, indium nitride, aluminum oxide, hafnium oxide, zirconium oxide, magnesium oxide, and gallium oxide;

implanting a p-type impurity directly into a surface of the first film and into the nitride semiconductor layer through the first film, to form a p-type semiconductor region in the nitride semiconductor layer, a thickness of the p-type semiconductor region being less than a thickness of the nitride semiconductor layer, and the implanting of the p-type impurity being performed at a temperature in a range from 500° C. to 600° C.;

after the implanting of the p-type impurity, introducing the substrate with the nitride semiconductor layer and the first film formed thereon into a metal organic chemical vapor deposition (MOCVD) apparatus, and forming a second film on the implanted surface of the first film at a temperature in a range from 300° C. to 800° C., the second film contacting the implanted surface of the first film and having a thickness in a range from 10 nm to 100 nm and comprising one of indium aluminum nitride, indium gallium nitride, aluminum nitride and gallium nitride;

after the forming of the second film, in the MOCVD apparatus, activating the p-type impurity implanted into the nitride semiconductor layer by performing a heat treatment of the nitride semiconductor layer at a temperature in a range from 900° C. to less than 1150° C., in an ammonia-containing atmosphere for a duration in a range from 1 minute to 60 minutes; and after the performing of the heat treatment, performing a wet etching to remove the first film and the second film, the wet etching comprising:

etching a part of the second film to expose a surface of the first film; and preferentially etching the exposed surface of the first film, wherein the preferentially etching of the exposed surface of the first film comprises simultaneously removing the first film and the second film.

23. A method of manufacturing a nitride semiconductor device, comprising:

forming a first film on a nitride semiconductor layer, the first film comprising a nitride semiconductor including at least one of aluminum and indium, and having a thickness in a range from 1 nm to 100 nm;

implanting a p-type impurity directly into a surface of the first film and into the nitride semiconductor layer through the first film by ion implantation, to form a p-type semiconductor region in the nitride semiconductor layer, a thickness of the p-type semiconductor region being less than a thickness of the nitride semiconductor layer, and the p-type impurity comprising one of magnesium and beryllium;

after the implanting of the p-type impurity, forming a second film on the implanted surface of the first film, the second film contacting the implanted surface of the first film and comprising a nitride semiconductor including at least one of aluminum and indium, and the second film being formed by metal organic chemical vapor deposition at a temperature in a range from 300° C. to 800° C.;

after the forming of the second film, heat treating the nitride semiconductor layer at a temperature in a range from 900° C. to 1600° C., the forming of the second film and the heat treating of the nitride semiconductor layer being performed in the same apparatus; and after the heat treating of the nitride semiconductor layer, performing a film removal process including removing the first film and the second film by wet etching, wherein the implanting of the p-type impurity is performed at a temperature in a range from 500° C. to 600° C., wherein the nitride semiconductor layer is formed on a front face of a substrate, and wherein the method further comprises:

before the film removal process, forming a third film on a rear face of the substrate to suppress a roughening of the rear face by the film removal process.

24. A method of manufacturing a nitride semiconductor device, comprising:

forming a nitride semiconductor layer on a substrate, the substrate comprising one member selected from the group consisting of gallium nitride (GaN), sapphire ($Al_2O_3$), silicon carbide (SiC), silicon (Si) and aluminum gallium nitride (AlGaN);

forming a first film on a surface of the nitride semiconductor layer, the first film contacting the surface of the nitride semiconductor layer and including less than 1% by molar fraction of N-type impurity, a thickness of the first film being in a range from 2 nm to 50 nm, and the first film comprising one of aluminum nitride, indium nitride, aluminum oxide, hafnium oxide, zirconium oxide, magnesium oxide, and gallium oxide;

implanting a p-type impurity directly into a surface of the first film and into the nitride semiconductor layer through the first film, to form a p-type semiconductor region in the nitride semiconductor layer, a thickness of the p-type semiconductor region being less than a thickness of the nitride semiconductor layer, and the implanting of the p-type impurity being performed at a temperature in a range from 500° C. to 600° C.;

after the implanting of the p-type impurity, introducing the substrate with the nitride semiconductor layer and the first film formed thereon into a metal organic chemical vapor deposition (MOCVD) apparatus, and forming a second film on the implanted surface of the first film at a temperature in a range from 300° C. to 800° C., the second film contacting the implanted surface of the first film and having a thickness in a range from 10 nm to 100 nm and comprising one of indium aluminum nitride, indium gallium nitride, aluminum nitride and gallium nitride;

after the forming of the second film, in the MOCVD apparatus, activating the p-type impurity implanted into the nitride semiconductor layer by performing a heat treatment of the nitride semiconductor layer at a temperature in a range from 900° C. to less than 1150° C., in an ammonia-containing atmosphere for a duration in a range from 1 minute to 60 minutes; and after the performing of the heat treatment, performing a wet etching to remove the first film and the second film, the wet etching comprising:

etching a part of the second film to expose a surface of the first film; and preferentially etching the exposed surface of the first film, wherein the nitride semiconductor layer is formed on a front face of a substrate, and wherein the method further comprises:

before the performing of the wet etching, forming a third film on a rear face of the substrate to suppress a roughening of the rear face by the performing of the wet etching.

* * * * *